United States Patent
Chiba et al.

(10) Patent No.: US 8,502,572 B2
(45) Date of Patent: Aug. 6, 2013

(54) GATE DRIVER

(75) Inventors: Akiteru Chiba, Niiza (JP); Yoichi Kyono, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 0 days.

(21) Appl. No.: 13/530,724

(22) Filed: Jun. 22, 2012

(65) Prior Publication Data

US 2013/0009675 A1    Jan. 10, 2013

(30) Foreign Application Priority Data

Jul. 4, 2011  (JP) .................................. 2011-147985

(51) Int. Cl.
    *H03K 3/00*    (2006.01)
(52) U.S. Cl.
    USPC .......................................... 327/109; 327/108
(58) Field of Classification Search
    USPC .................................. 327/109, 108
    See application file for complete search history.

(56) References Cited

U.S. PATENT DOCUMENTS

| | | | |
|---|---|---|---|
| 2010/0079176 A1* | 4/2010 | Chung et al. | 327/108 |
| 2010/0213988 A1* | 8/2010 | Xiao | 327/109 |
| 2011/0221482 A1* | 9/2011 | Kim et al. | 327/109 |
| 2012/0153995 A1* | 6/2012 | Oughton et al. | 327/109 |
| 2012/0299625 A1* | 11/2012 | Sasaki | 327/109 |
| 2012/0326757 A1* | 12/2012 | Strzalkowski | 327/109 |

FOREIGN PATENT DOCUMENTS

JP    2001-345194    12/2001

* cited by examiner

*Primary Examiner* — Ryan Jager
(74) *Attorney, Agent, or Firm* — Oblon, Spivak, McClelland, Maier & Neustadt, L.L.P.

(57) ABSTRACT

A gate driver of a switching element Q1 includes transistors Q2 and Q3 that are totem-pole-connected to both ends of a DC power source Vcc1, transistors Q4 and Q5 that are totem-pole-connected to both ends of a DC power source Vcc2 and have emitters connected to the gate of the switching element Q1, and a transformer T1 having a primary winding and a secondary winding. The primary winding is connected to a collector of one of the transistors Q1 and Q2, and through a capacitor, emitters of the transistors Q1 and Q2. The second winding is connected to bases of the transistors Q4 and Q5 and the emitters of the transistors Q4 and Q5. A maximum duty cycle of a pulse signal is determined according to a primary winding voltage of the transformer and a forward base-emitter voltage of the transistors Q4 and Q5.

3 Claims, 4 Drawing Sheets

US 8,502,572 B2

GATE DRIVER

BACKGROUND OF THE INVENTION

1. Field of the Invention

The present invention relates to a gate driver for driving the gate of a semiconductor switching element of SiC, GaN, or the like.

2. Description of Related Art

FIG. 1 is a circuit diagram illustrating a gate driver according to a related art. The gate driver drives the gate of a switching element Q1 of a FET. The gate driver includes a pulse transformer T1 having a primary winding P1 and a secondary winding S1. The primary and secondary windings P1 and S1 have a turn ratio of 1:1.

In FIG. 1, both ends of a DC power source Vcc1 are connected to an npn-type transistor Q2 and a pnp-type transistor Q3. The transistors Q2 and Q3 are connected to each other in a totem-pole configuration. Bases of the transistors Q2 and Q3 receive a pulse signal Vin through a resistor R1 and emitters thereof are connected through a capacitor C1 to a first end of the primary winding P1 of the transformer T1. A second end of the primary winding P1 is connected to a collector of the transistor Q3 and a negative electrode of the DC power source Vcc1.

A first end of the secondary winding S1 of the transformer T1 is connected through a resistor R2 to the gate of the switching element Q1 and a second end of the secondary winding S1 is connected to a source of the switching element Q1.

When the pulse signal Vin has an ON duty of 50% or lower as illustrated in FIG. 2A, a peak value of a gate voltage of the switching element Q1 becomes equal to or higher than a gate-source threshold of the switching element Q1, and therefore, the switching element Q1 is driven.

Another related art is disclosed in, for example, Japanese Unexamined Patent Application Publication No. 2001-345194.

SUMMARY OF THE INVENTION

When the pulse signal Vin of the related art of FIG. 1 has an ON duty of over 50% as illustrated in FIG. 2B, a secondary winding voltage of the transformer T1 balances according to a voltage time integration rule, to equalize positive and negative areas of the gate voltage of the switching element Q1. Then, a peak value of the gate voltage of the switching element Q1 never reaches the gate-source threshold of the switching element Q1, and therefore, the switching element Q1 is not driven.

The present invention provides a gate driver that is low-cost and capable of driving the gate of a switching element even with a pulse signal having an ON duty of 50% or over.

According to an aspect of the present invention, the gate driver for driving a gate of a switching element includes first and second transistors that are totem-pole-connected to both ends of a first DC power source and have control terminals to which a pulse signal is applied, third and fourth transistors that are totem-pole-connected to both ends of a second DC power source and have first main terminals connected to the gate of the switching element, and a transformer having primary and secondary windings. The primary winding is connected to a second main terminal of one of the first and second transistors, and through a capacitor, first main terminals of the first and second transistors. The second winding is connected to control terminals of the third and fourth transistors and the first main terminals of the third and fourth transistors. A maximum duty cycle of the pulse signal is determined according to a primary winding voltage of the transformer and a forward control-terminal voltage of the third and fourth transistors.

DESCRIPTION OF PREFERRED EMBODIMENTS

Gate drivers according to embodiments of the present invention will be explained in detail with reference to the drawings.

Embodiment 1

Figure 1:
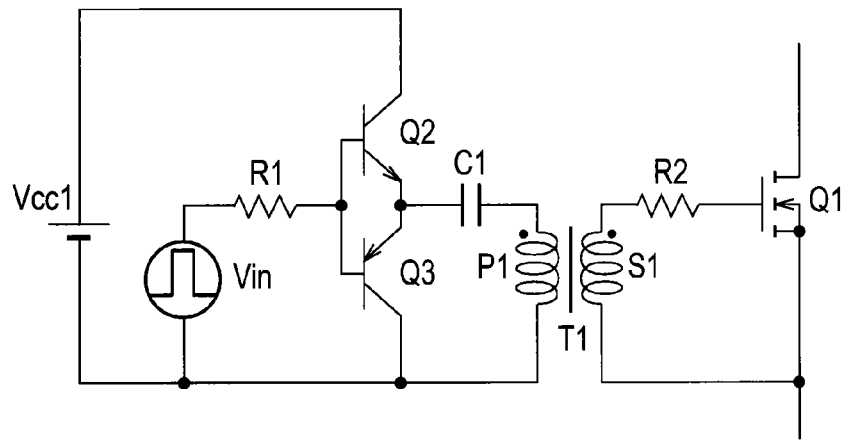
FIG. 1 is a circuit diagram illustrating a gate driver according to a related art.
Figure 2A:
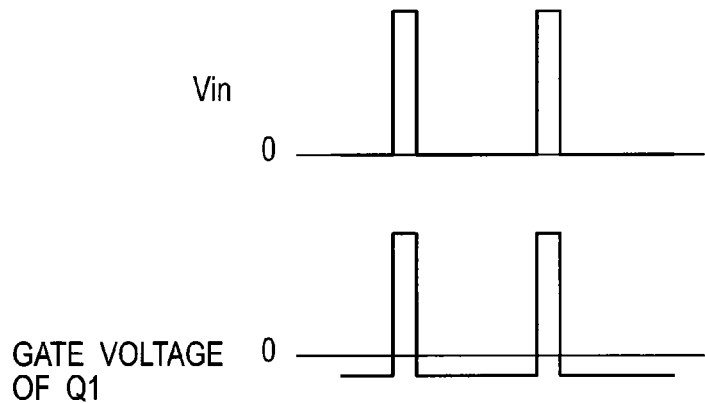
FIG. 2A is a waveform diagram illustrating a pulse signal Vin having an ON duty of 50% or lower and a gate voltage of a switching element Q1 in the gate driver of FIG. 1.
Figure 2B:
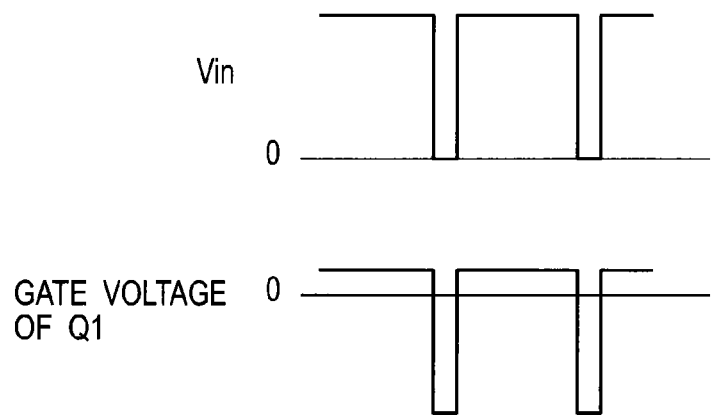
FIG. 2B is a waveform diagram illustrating a pulse signal Vin having an ON duty of over 50% and a gate voltage of the switching element Q1 in the gate driver of FIG. 1.
Figure 3:
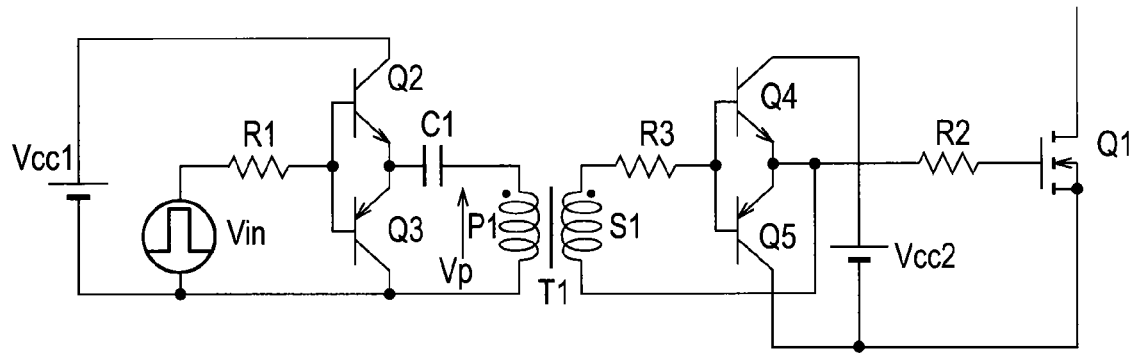
FIG. 3 is a circuit diagram illustrating a gate driver according to Embodiment 1 of the present invention.

FIG. 3 is a circuit diagram illustrating a gate driver according to Embodiment 1 of the present invention. Compared with the gate driver according to the related art of FIG. 1, the gate driver according to Embodiment 1 of FIG. 3 additionally employs a resistor R3, a transistor Q4 (corresponding to the third transistor in the claims), a transistor Q5 (corresponding to the fourth transistor in the claims), and a DC power source Vcc2 (corresponding to the second DC power source in the claims).

Both ends of the DC power source Vcc2 are connected to the npn-type transistor Q4 and pnp-type transistor Q5. The transistors Q4 and Q5 are connected in a totem-pole manner. Emitters (corresponding to the first main terminals in the claims) of the transistors Q4 and Q5 are connected through a resistor R2 to a gate of a switching element Q1.

Bases (corresponding to the control terminals in the claims) of the transistors Q4 and Q5 are connected through the resistor R3 to a first end of a secondary winding S1 of a transformer T1. A second end of the secondary winding S1 is connected to the emitters of the transistors Q4 and Q5.

A pulse signal Vin is applied through a resistor R1 to bases of transistors Q2 (corresponding to the first transistor in the claims) and Q3 (corresponding to the second transistor in the claims). A maximum ON duty cycle of the pulse signal Vin is determined according to a primary winding voltage of the transformer T1 and a forward base voltage VF (corresponding to the forward control-terminal voltage in the claims) of the transistors Q4 and Q5.

In FIG. 3, a DC power source Vcc1 corresponds to the first DC power source stipulated in the claims. The emitter of each of the transistors Q2 to Q5 correspond to the first main terminal, the base thereof to the control terminal, and the collector thereof to the second main terminal stipulated in the claims.

Figure 4:
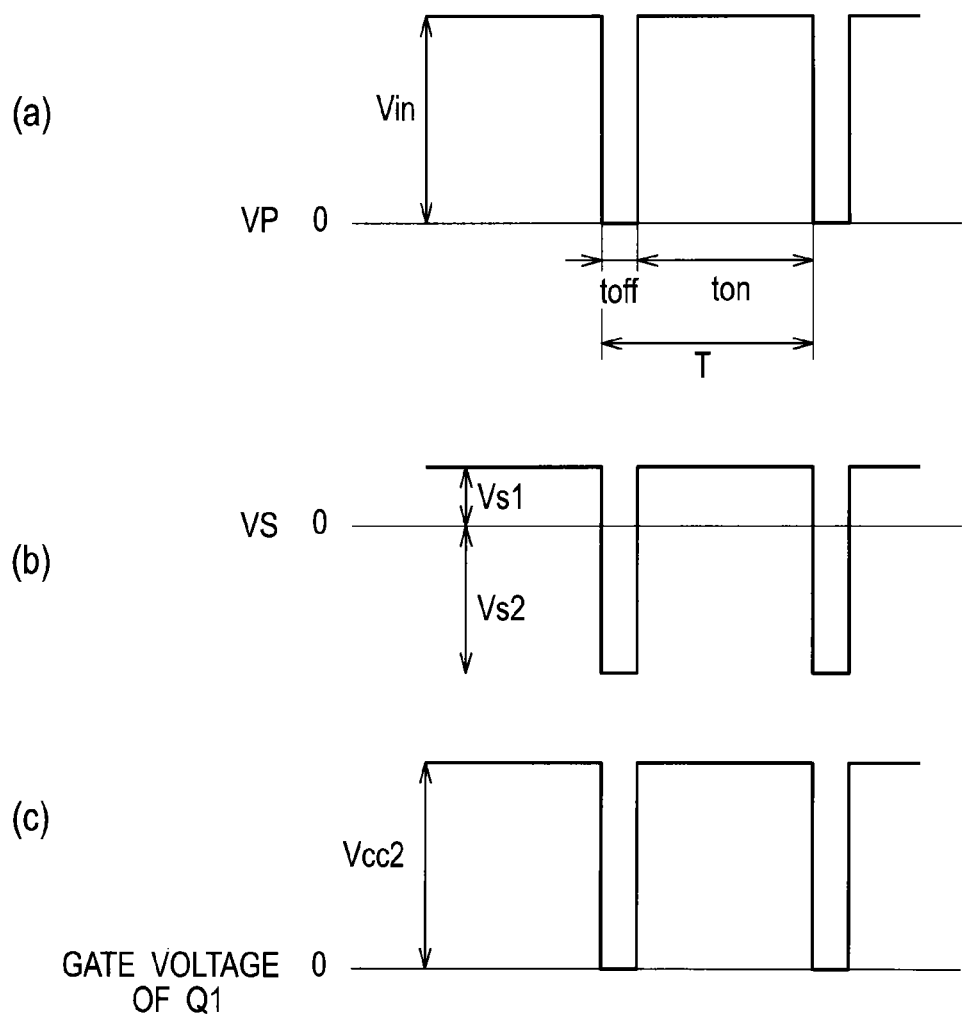
FIG. 4 is a waveform diagram illustrating primary and secondary winding voltages of a transformer in the gate driver of FIG. 3.

When the primary winding voltage Vp of the primary winding P1 of the transformer T1 has an ON duty cycle of over 50% as illustrated in FIG. 4, the secondary winding S1 of the transformer T1 generates a voltage corresponding to the primary winding voltage Vp, to clockwise pass a current through a path extending along the first end of S1, R3, the base of Q4, the emitter of Q4, and the second end of S1.

Also, a current passes through a path extending along Vcc2, the collector of Q4, the emitter of Q4, R2, and the gate of Q1. As a result, the secondary winding voltage of the transfoLmer T1 illustrated in FIG. 4 will have a peak voltage Vs1 that exceeds a threshold of the switching element Q1. Namely, if the peak voltage Vs1 is secured for the forward base voltage VF of the transistor Q4 or Q5, a gate pulse having a power source voltage of the DC power source Vcc2 is applied to the gate of the switching element Q1.

This will be explained in more detail. In FIG. 3, it is assumed that the primary and secondary windings P1 and S1 of the transformer T1 have a turn ratio of 1:1 and the primary winding P1 provides the primary winding voltage Vp. The primary winding voltage Vp has a certain pulse width as illustrated in FIG. 4. According to the voltage time integration balancing rule, the secondary winding S1 of the transformer T1 provides a secondary winding voltage as illustrated in FIG. 4. The secondary winding voltage is expressed as follows:

$$Vs1 \cdot ton = Vs2 \cdot toff$$

where, $$Vp = Vs1 + Vs2$$

$$T = ton + toff$$

and therefore, $$ton/T = 1 - (Vs1/Vp) \qquad (1).$$

According to the expression (1), the ON duty cycle ton/T of a gate pulse applied to the switching element Q1 is expressible with the primary winding voltage Vp (applied voltage) of the transformer T1 and the peak voltage Vs1 of the secondary winding S1 of the transformer T1.

Figure 5:
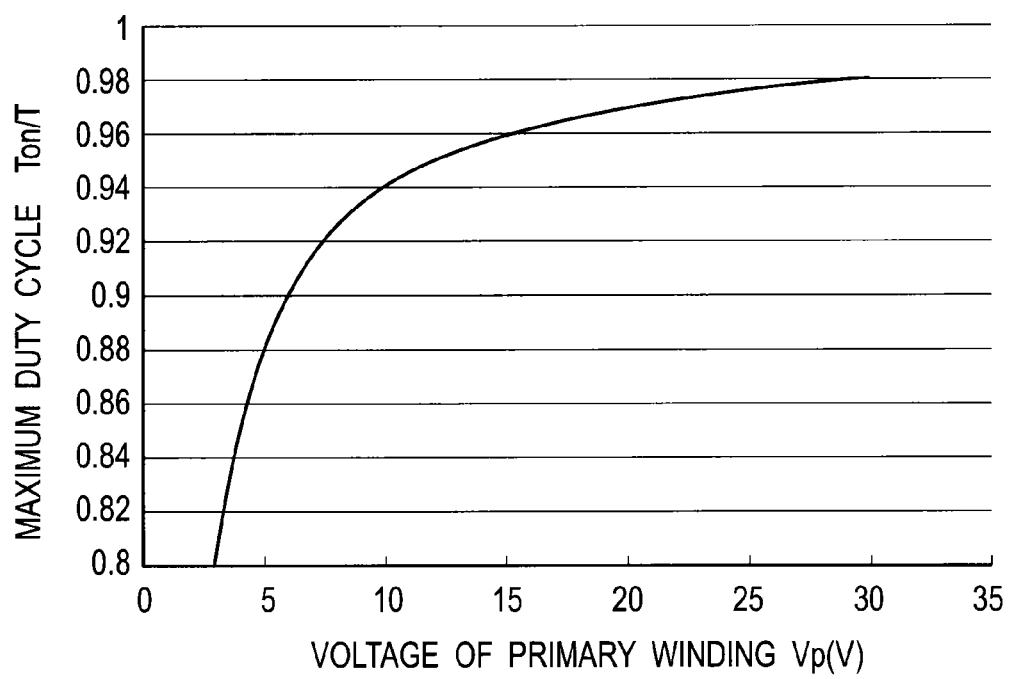
FIG. 5 is a graph illustrating a relationship between the primary winding voltage Vp and a maximum ON duty Ton/T of the gate driver of FIG. 3.

If the forward base voltage VF of the transistor Q4 or Q5 is 0.6 V, a relationship between the primary winding voltage Vp and a maximum ON duty will follow a curve illustrated in FIG. 5. As is apparent in FIG. 5, even if the primary winding voltage Vp (pulse signal) has an ON duty cycle of 90% or over, it is able to sufficiently drive the switching element Q1.

Accordingly, a pulse generator for generating the pulse signal Vin is allowed to apply the pulse signal Vin having an ON duty cycle of 90% or over through the resistor R1 to the transistors Q2 and Q3.

The gate driver according to Embodiment 1 additionally employs only the DC power source Vcc2, transistors Q4 and Q5, and resistor R3, and therefore, is simple, low-cost, and high-speed. Unlike the related art of FIG. 1 that directly drives the gate of the switching element Q1 with the transformer T1, the gate driver of Embodiment 1 drives the switching element Q1 through a buffer, i.e., the totem-pole-connected transistors Q4 and Q5 to reduce the power consumption of the transformer T1.

The buffer with the totem-pole-connected transistors Q4 and Q5 is a circuit that operates as a current driver, and therefore, the gate driver according to Embodiment 1 is highly resistive to noise.

Embodiment 2

Figure 6:
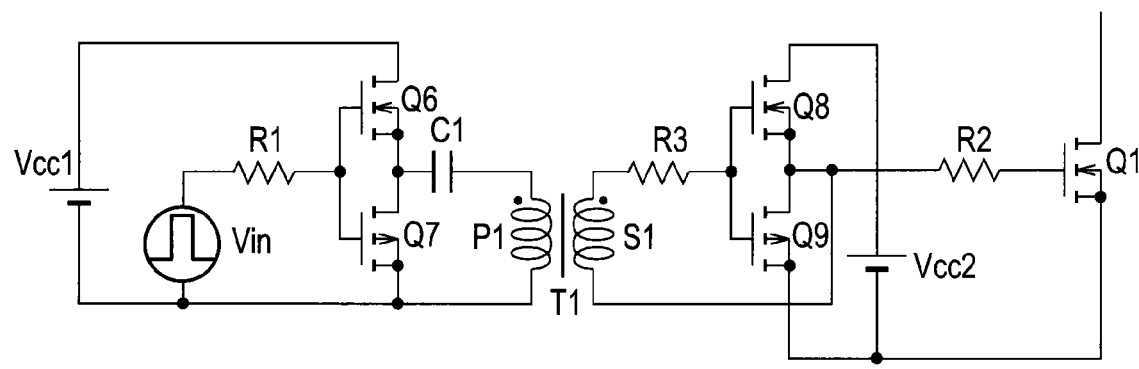
FIG. 6 is a circuit diagram illustrating a gate driver according to Embodiment 2 of the present invention.

FIG. 6 is a circuit diagram illustrating a gate driver according to Embodiment 2 of the present invention. Instead of the transistors Q2 to Q5 of Embodiment 1, Embodiment 2 employs FETs Q6 to Q9.

The FETs Q6 and Q8 are p-type MOSFETs and the FETs Q7 and Q9 are n-type MOSFETs. With the FETs Q6 to Q9, the gate driver of Embodiment 2 provides operation and effects similar to those of the gate driver of Embodiment 1.

The FETs Q6 to Q9 may be GaN-FETs, SiC-FETs, or the like. The GaN-FETs and SiC-FETs will improve the operating speed of the gate driver.

Embodiment 3

Figure 7:
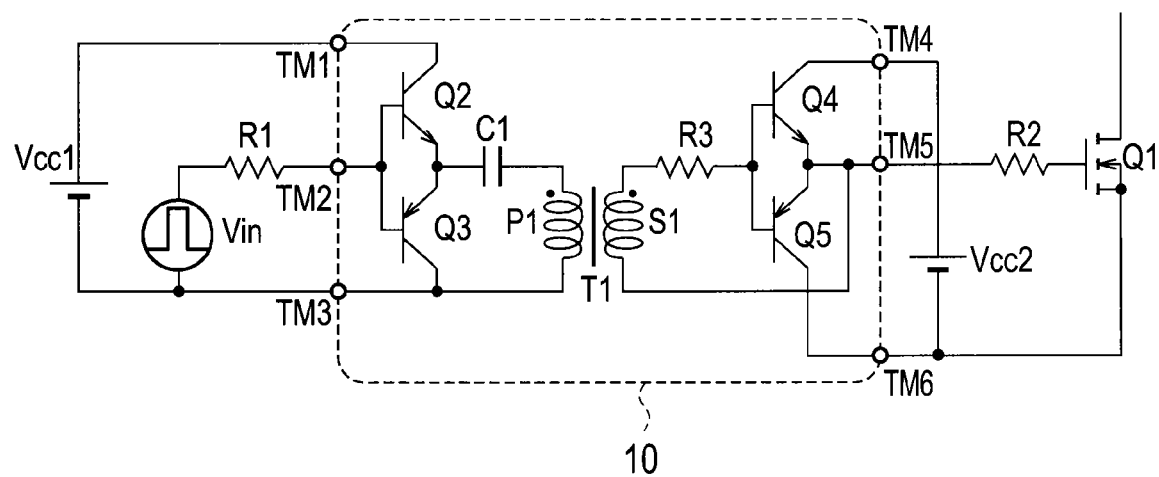
FIG. 7 is a circuit diagram illustrating a gate driver according to Embodiment 3 of the present invention.

FIG. 7 is a circuit diagram illustrating a gate driver according to Embodiment 3 of the present invention. Embodiment 3 arranges the transistors Q2 and Q3, transistors Q4 and Q5, transformer T1, capacitor C1, and resistor R3 of Embodiment 1 illustrated in FIG. 3 in an insulated package 10 provided with pin terminals TM1 to TM6.

The pin terminal TM1 connects a positive electrode of a DC power source Vcc1 to a collector of the transistor Q2. The pin terminal TM2 connects a first end of a resistor R1 to bases of the transistors Q2 and Q3. The pin terminal TM3 connects a negative electrode of the DC power source Vcc1 to a collector of the transistor Q3.

The pin terminal TM4 connects a positive electrode of a DC power source Vcc2 to a collector of the transistor Q4. The pin terminal TM5 connects a first end of a resistor R2 to emitters of the transistors Q4 and Q5. The pin terminal TM6 connects a negative electrode of the DC power source Vcc2 to a collector of the transistor Q5.

According to the present embodiment, the transistors Q2 and Q3, transistors Q4 and Q5, transformer T1, capacitor C1, and resistor R3 are accommodated in the insulated package 10, to realize an insulated gate driver.

As mentioned above, the gate driver according to the present invention employs the third and fourth transistors that are totem-pole-connected to both ends of the second DC power source. The control terminals and first main terminals of the third and fourth transistors are connected to the secondary winding of the transformer. A maximum ON duty of the pulse signal applied to the control terminals of the first and second transistors is determined according to a primary winding voltage of the transformer and a forward control-terminal voltage of the third and fourth transistors. With this configuration, the gate driver is low-cost and is capable of driving the gate of the switching element even if the pulse signal has an ON duty of over 50%.

The present invention is applicable to DC-DC converters and AC-DC converters.

This application claims benefit of priority under 35 USC §119 to Japanese Patent Application No. 2011-147985, filed on Jul. 4, 2011, the entire contents of which are incorporated by reference herein.

What is claimed is:

1. A gate driver for driving a gate of a switching element, comprising:
   a first transistor and a second transistor that are connected in a manner of totem pole to both ends of a first DC power source and have control terminals to which a pulse signal is applied;
   a third transistor and a fourth transistor that are connected in a manner of totem pole to both ends of a second DC power source and have first main terminals connected to the gate of the switching element; and a transformer having a primary winding and a secondary winding, the primary winding being connected to a second main terminal of one of the first and second transistors, and through a capacitor, first main terminals of the first and second transistors, and the second winding being connected to control terminals of the third and fourth transistors and the first main terminals of the third and fourth transistors, wherein a maximum duty cycle of the pulse signal is determined according to a primary winding voltage of the transformer and a forward control-terminal voltage of the third and fourth transistors.

2. The gate driver of claim 1, wherein the first and second transistors form a first transistor group, the third and fourth transistors form a second transistor group, and each transistor of at least one of the transistor groups is selected from a group of a FET, a GaN-FET, and an SiC-FET.

3. The gate driver of claim 1, wherein the first and second transistors, third and fourth transistors, transformer, and capacitor are arranged in an insulated package.

\* \* \* \* \*